(12) United States Patent
Tu et al.

(10) Patent No.: US 10,971,565 B2
(45) Date of Patent: Apr. 6, 2021

(54) PIXEL STRUCTURE

(71) Applicant: Au Optronics Corporation, Hsinchu (TW)

(72) Inventors: Chen-Yuan Tu, New Taipei (TW); Chen-Chung Wu, Kaohsiung (TW); Tai-Tso Lin, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/595,408

(22) Filed: Oct. 7, 2019

(65) Prior Publication Data
US 2020/0335565 A1      Oct. 22, 2020

(30) Foreign Application Priority Data

Apr. 18, 2019   (TW) .................................. 108113586

(51) Int. Cl.
*H01L 27/32*     (2006.01)
*H01L 51/52*     (2006.01)
*H01L 27/12*     (2006.01)
*G02F 1/00*      (2006.01)

(52) U.S. Cl.
CPC ........ *H01L 27/3248* (2013.01); *G02F 1/0063* (2013.01); *H01L 27/3262* (2013.01); *H01L 27/3272* (2013.01)

(58) Field of Classification Search
CPC ............. H01L 27/3248; H01L 27/3262; H01L 27/3272
See application file for complete search history.

(56) References Cited

U.S. PATENT DOCUMENTS

| 5,121,237 | A | * | 6/1992 | Ikeda ................ G02F 1/136209 |
| | | | | 349/110 |
| 5,781,254 | A | | 7/1998 | Kim et al. |
| 5,847,792 | A | | 12/1998 | Kobayashi et al. |
| 9,851,820 | B2 | | 12/2017 | Yamazaki et al. |

(Continued)

FOREIGN PATENT DOCUMENTS

| CN | 100447628 | 12/2008 |
| CN | 106255999 | 12/2016 |

(Continued)

OTHER PUBLICATIONS

"Written Opinion and Search Report of Singapore Counterpart Application", dated Oct. 5, 2020, p. 1-p. 8.

*Primary Examiner* — Herve-Louis Y Assouman
(74) *Attorney, Agent, or Firm* — JCIPRNET

(57) ABSTRACT

A pixel structure includes a substrate, a thin film transistor disposed on the substrate and having a first end, a second end and a control end, a first signal line electrically connected to the first end of the thin film transistor, a second signal line electrically connected to the control end of the thin film transistor, a pixel electrode electrically connected to the second end of the thin film transistor, and a light shielding layer. At least one of the first end of the thin film transistor, the second end of the thin film transistor, the control end of the thin film transistor, the first signal line and the second signal line is formed of a conductive layer. The light shielding layer is disposed on a top surface and a sidewall of the conductive layer. The light shielding layer includes a photoresist and particles mixed within the photoresist.

9 Claims, 15 Drawing Sheets

(56) References Cited

U.S. PATENT DOCUMENTS

| | | | |
|---|---|---|---|
| 2013/0265459 A1* | 10/2013 | Duparre | H04N 13/271 348/218.1 |
| 2015/0179668 A1 | 6/2015 | Niu | |
| 2016/0299387 A1 | 10/2016 | Yamazaki et al. | |
| 2016/0300902 A1 | 10/2016 | You et al. | |
| 2017/0031192 A1 | 2/2017 | Yamazaki et al. | |
| 2017/0031471 A1 | 2/2017 | Yamazaki et al. | |
| 2017/0033172 A1 | 2/2017 | Yamazaki et al. | |
| 2018/0166585 A1* | 6/2018 | Takechi | H01L 27/12 |
| 2018/0203313 A1* | 7/2018 | Wang | G02F 1/1368 |
| 2018/0204769 A1* | 7/2018 | Xu | H01L 27/3258 |

FOREIGN PATENT DOCUMENTS

| | | |
|---|---|---|
| TW | I426563 | 2/2014 |
| TW | I651574 | 2/2019 |

* cited by examiner

PIXEL STRUCTURE

CROSS-REFERENCE TO RELATED APPLICATION

This application claims the priority benefit of Taiwan application serial no. 108113586, filed on Apr. 18, 2019. The entirety of the above-mentioned patent application is hereby incorporated by reference herein and made a part of this specification.

BACKGROUND OF THE INVENTION

Field of the Invention

The disclosure relates to a pixel structure.

Description of Related Art

The display panel includes a pixel array substrate, an opposite substrate, and a display medium disposed between the pixel array substrate and the opposite substrate. The pixel array substrate includes a substrate and pixel structures disposed on the substrate. Each pixel structure includes a signal line, an active component electrically connected to the signal line, and a pixel electrode electrically connected to the active component.

In general, based on conductivity considerations, a portion of the signal line and/or the active component is mostly made of a metal layer. The metal layer has good conductivity but is reflective. In a lighting environment, when the display panel is in use, a portion of the signal line and/or the active component reflects the ambient light beam, causing a drop in the ambient contrast ratio (ACR) of the display panel.

SUMMARY OF THE INVENTION

The invention provides a pixel structure, and a display panel with good optical performance can be made by using the pixel structure.

The pixel structure of the invention includes a substrate, a thin film transistor disposed on the substrate and having a first end, a second end and a control end, a first signal line electrically connected to the first end of the thin film transistor, a second signal line electrically connected to the control end of the thin film transistor, a pixel electrode electrically connected to the second end of the thin film transistor, and a first light shielding layer. At least one of the first end of the thin film transistor, the second end of the thin film transistor, the control end of the thin film transistor, the first signal line and the second signal line is formed of a first conductive layer. The first light shielding layer is disposed on a top surface and a sidewall of the first conductive layer. The first light shielding layer includes a first photoresist and first particles mixed within the first photoresist.

In an embodiment of the invention, a material of the first photoresist includes a phenolic resin, an acrylic resin, a siloxane or a combination thereof.

In an embodiment of the invention, a material of the first particles includes carbon, titanium oxide, titanium nitride or a combination thereof.

In an embodiment of the invention, the first particles are light absorbing particles.

In an embodiment of the invention, the first light shielding layer includes a first light shielding pattern and a second light shielding pattern. The first light shielding pattern is disposed on a top surface of the first end of the thin film transistor and a sidewall of the first end of the thin film transistor. The second light shielding pattern is disposed on a top surface of the second end of the thin film transistor and a sidewall of the second end of the thin film transistor. A gap is provided between the first light shielding pattern and the second light shielding pattern.

In an embodiment of the invention, a width of the gap is L, and L≥0.5 μm.

In an embodiment of the invention, an edge of a vertical projection of the first conductive layer on the substrate is at a distance d from an edge of a vertical projection of the first light shielding layer on the substrate, and 0.1 μm≤d≤1.5 μm.

In an embodiment of the invention, the first end of the thin film transistor, the second end of the thin film transistor, the control end of the thin film transistor, the first signal line and the second signal line are formed of the first conductive layer and a second conductive layer. The pixel structure further includes an insulating layer and a second light shielding layer. The insulating layer is disposed between the first conductive layer and the second conductive layer. The second light shielding layer is disposed on a top surface of the second conductive layer and a sidewall of the second conductive layer. The second light shielding layer includes a second photoresist and second particles mixed within the second photoresist.

In an embodiment of the invention, a material of the second photoresist includes a phenolic resin, an acrylic resin, a siloxane or a combination thereof.

In an embodiment of the invention, a material of the second particles includes carbon, titanium oxide, titanium nitride or a combination thereof.

Based on the above, since the light shielding layer is disposed on the top surface and the sidewall of the conductive layer, the light shielding layer can reduce the amount of the ambient light beam reflected by the top surface of the conductive layer, and can also reduce the amount of the ambient light beam reflected by the sidewall of the conductive layer. Thereby, the display panel using the above pixel structure can have good optical performance, for example, high ambient contrast ratio (ACR).

In order to make the aforementioned and other objectives and advantages of the invention comprehensible, embodiments accompanied with figures are described in detail below.

DESCRIPTION OF THE EMBODIMENTS

Figure 1A:
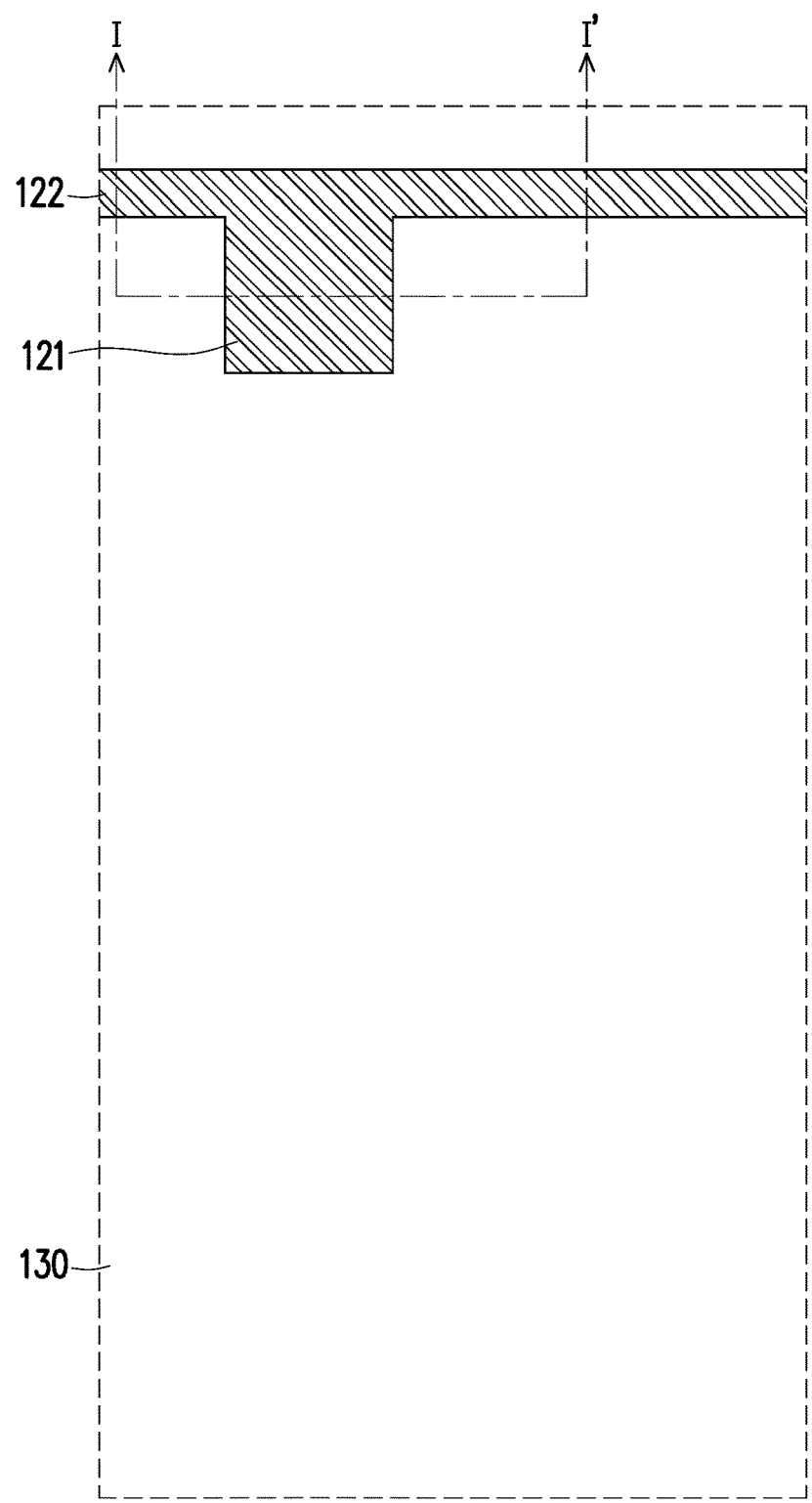
FIG. 1A to FIG. 1F are top schematic views of a manufacturing process of a pixel structure PX according to an embodiment of the invention.

Reference will now be made in detail to the present exemplary embodiments of the invention, examples of which are illustrated in the accompanying drawings. Wherever possible, the same reference numbers are used in the drawings and the description to refer to the same or like parts.

In the accompanying drawings, the thicknesses of layers, films, panels, regions, and the like are enlarged for clarity. Throughout the specification, same reference numerals indicate same components. It should be understood that when a component such as a layer, film, region or substrate is referred to as being "on" or "connected" to another component, it may be directly on or connected to the another component, or intervening components may also be present. In contrast, when a component is referred to as being "directly on" or "directly connected to" another component, there are no intervening assemblies present. As used herein, "connection" may refer to a physical and/or electrical connection.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

Unless otherwise defined, all terms (including technical and scientific terms) used herein have the same meaning as commonly understood by one of ordinary skill in the art to which the invention belongs. It will be further understood that terms such as those defined in commonly used dictionaries should be interpreted as having a meaning that is consistent with their meaning in the context of the relevant art and the invention and will not be interpreted in an idealized or overly formal sense unless expressly so defined herein.

FIG. 1A to FIG. 1F are top schematic views of a manufacturing process of a pixel structure PX according to an embodiment of the invention.

FIG. 2A to FIG. 2F are cross-sectional schematic views of the manufacturing process of a pixel structure PX according to an embodiment of the invention. FIG. 2A to FIG. 2F respectively correspond to line I-I' of FIG. 1A to FIG. 1F.

The manufacturing process and the configuration of the pixel structure PX according to an embodiment of the invention will be illustrated below with reference to FIG. 1A to FIG. 1F and FIG. 2A to FIG. 2F.

Figure 2A:
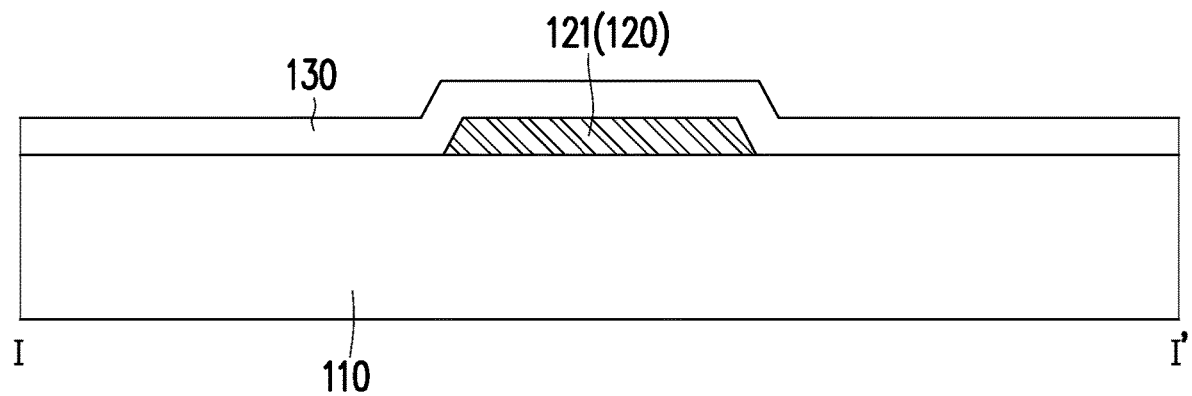
FIG. 2A to FIG. 2F are cross-sectional schematic views of the manufacturing process of a pixel structure PX according to an embodiment of the invention.

Referring to FIG. 1A and FIG. 2A, firstly, a substrate 110 is provided. For example, in the present embodiment, the material of the substrate 110 may be glass, quartz, an organic polymer, or an opaque/reflective material (such as wafer, ceramic, or other suitable materials), or other suitable materials.

Next, a conductive layer 120 is formed on the substrate 110. The conductive layer 120 includes a conductive pattern 121 and a second signal line 122 connected to the conductive pattern 121. In the present embodiment, the conductive pattern 121 may be used as a control end of the thin film transistor T (shown in FIG. 1D and FIG. 2D), and the second signal line 122 may be a scan line.

For example, in the present embodiment, the conductive layer 120 may include molybdenum (Mo) and copper (Cu) stacked on the molybdenum. However, the invention is not limited thereto, and according to other embodiments, the conductive layer 120 may also use other conductive materials, such as an alloy, a nitride of a metal material, an oxide of a metal material, an oxynitride of a metal material, or a stacked layer of a metal material and other conductive materials.

Next, an insulating layer 130 is formed to cover the conductive layer 120 and a portion of the substrate 110. In the present embodiment, the insulating layer 130 may also be referred to as a gate insulating layer. The material of the insulating layer 130 may be an inorganic material (for example, silicon oxide, silicon nitride, silicon oxynitride, or a stacked layer of at least two materials described above), an organic material, or a combination thereof.

Figure 1B:
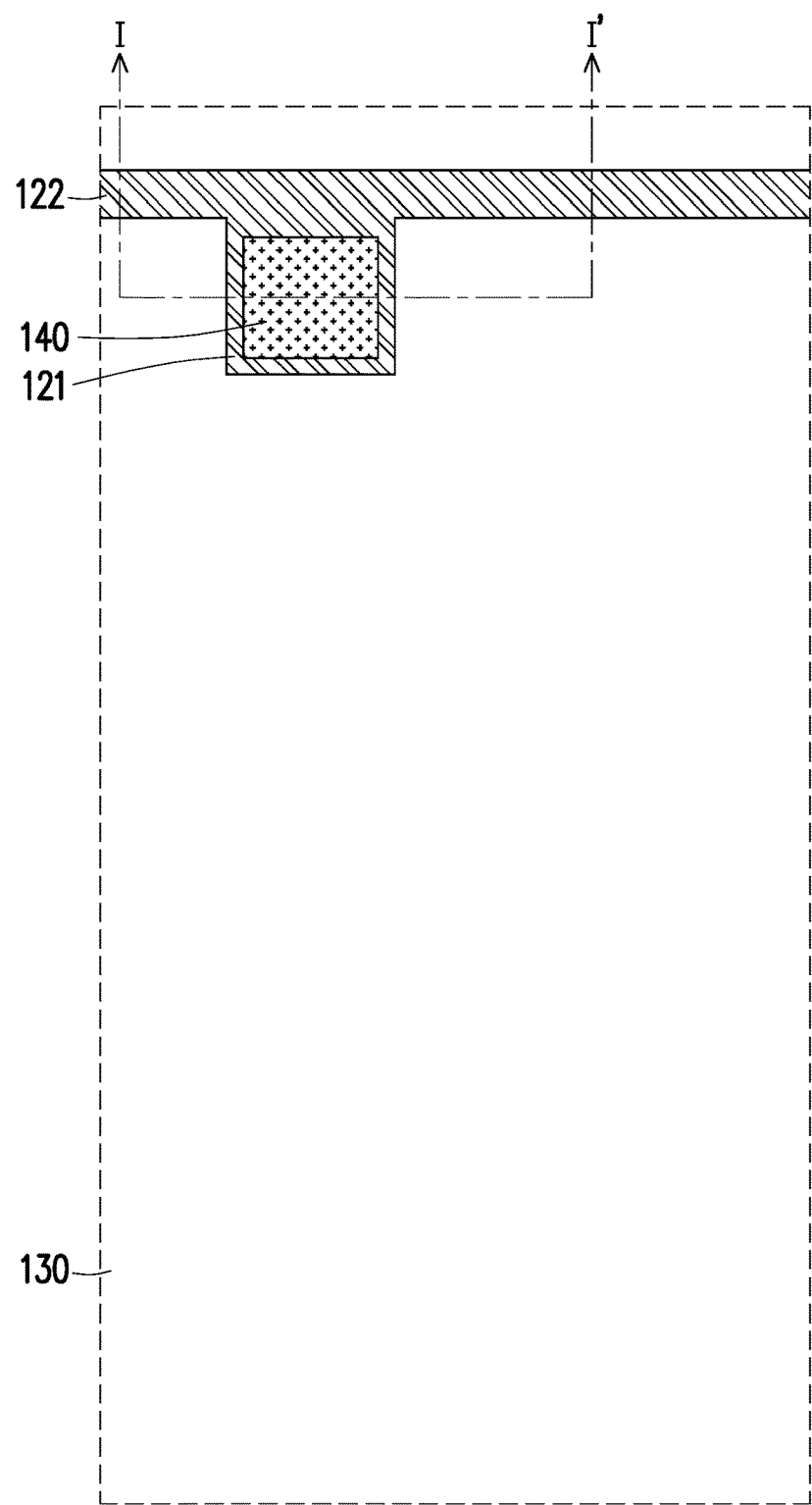
Figure 2B:
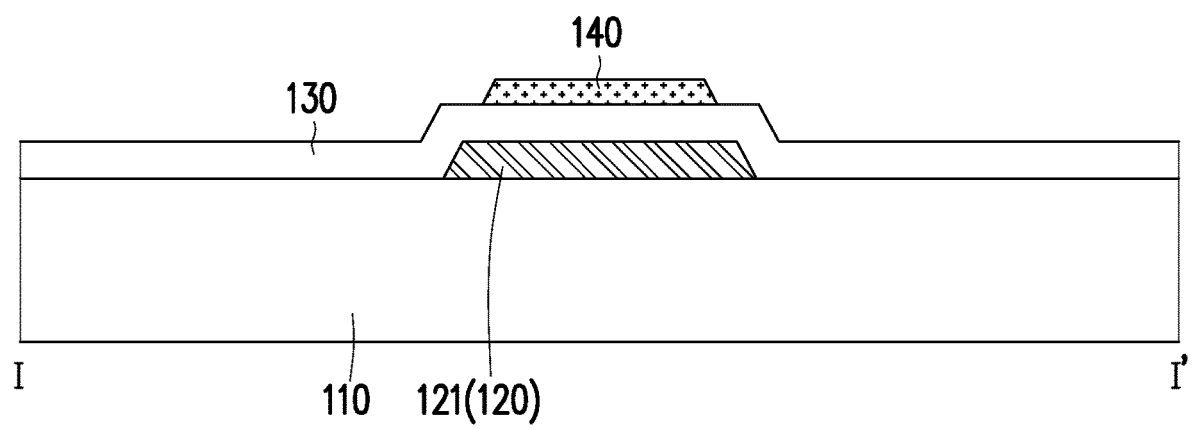

Referring to FIG. 1B and FIG. 2B, next, a semiconductor pattern 140 is formed on the insulating layer 130. For example, in the present embodiment, the material of the semiconductor pattern 140 may be of a single-layer or a multilayer structure including amorphous silicon, polycrystalline silicon, microcrystalline silicon, monocrystalline silicon, an organic semiconductor material, an oxide semiconductor material (for example, indium zinc oxide, indium gallium zinc oxide, or other suitable materials, or a combination thereof), or other suitable materials, or the above materials containing a dopant, or a combination thereof.

Figure 1C:
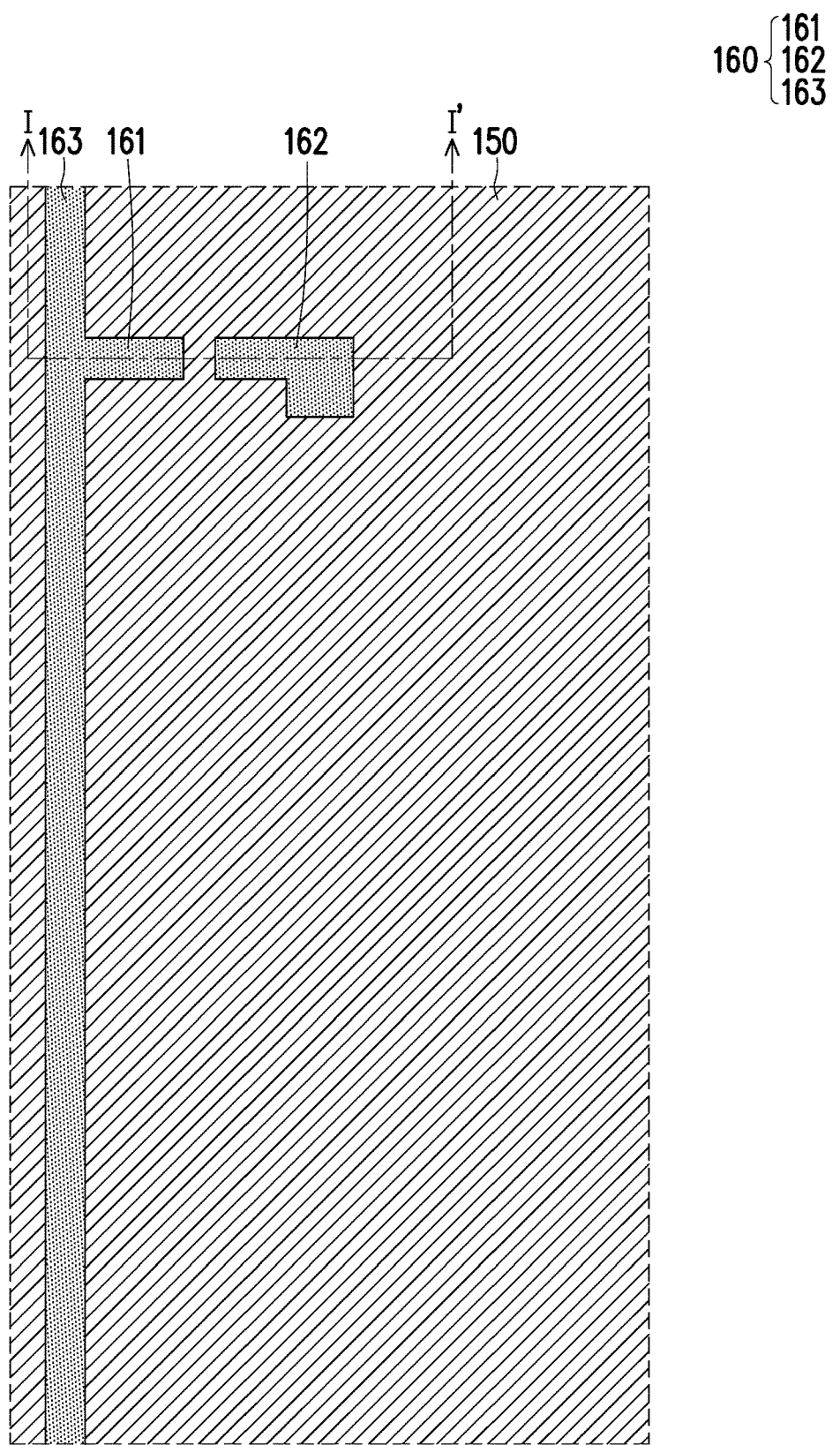
Figure 1D:
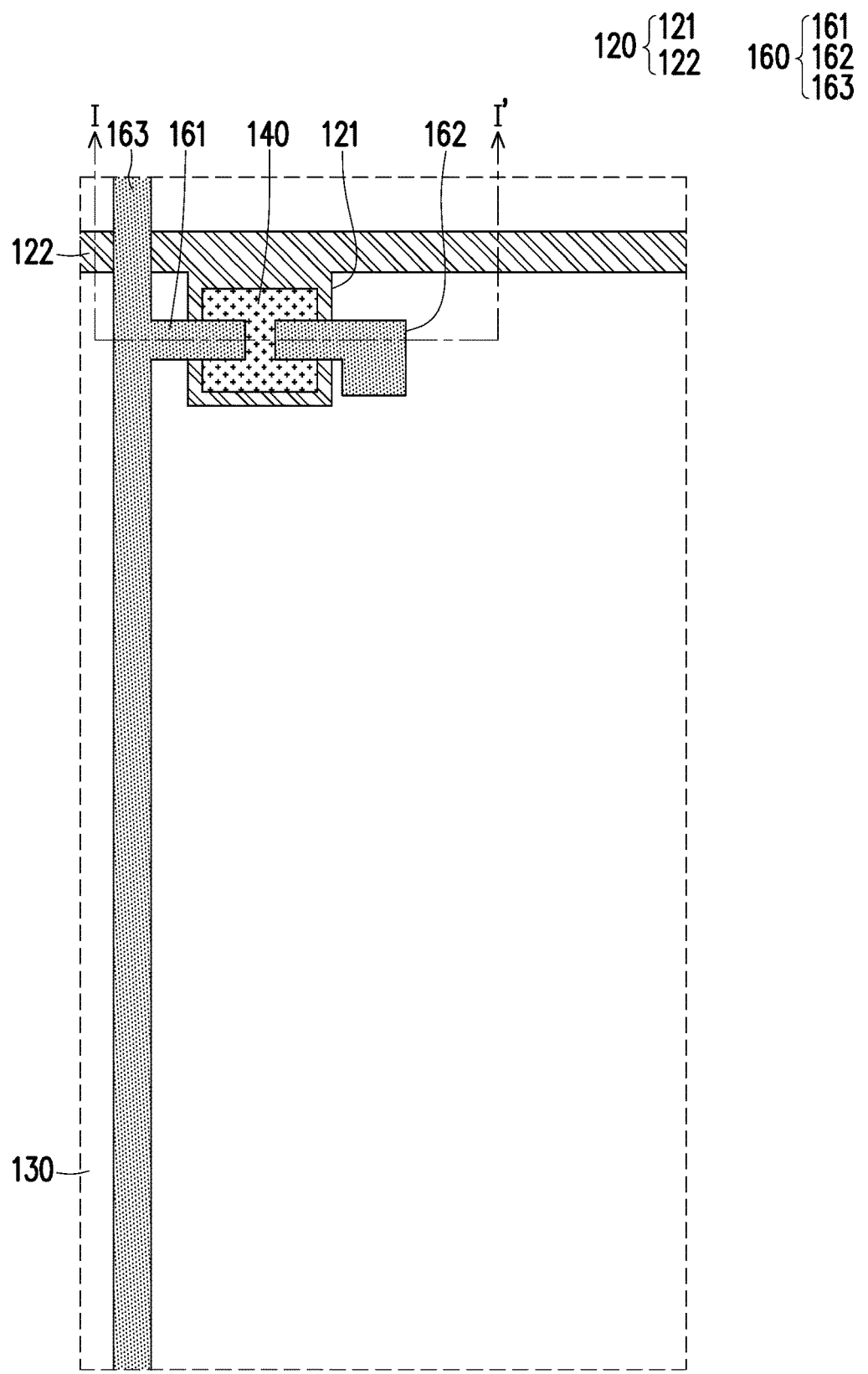
Figure 2C:
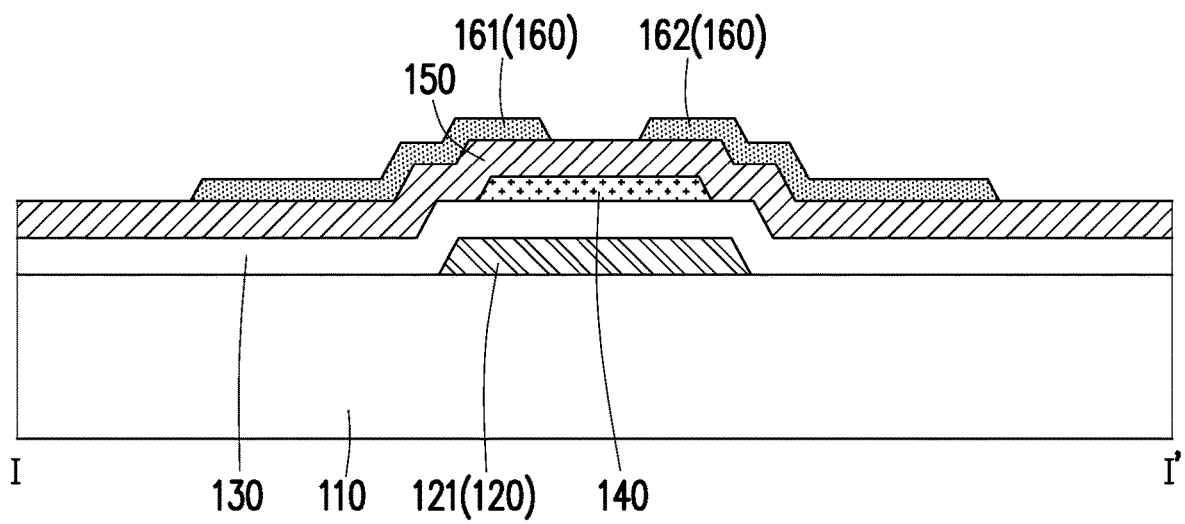
Figure 2D:
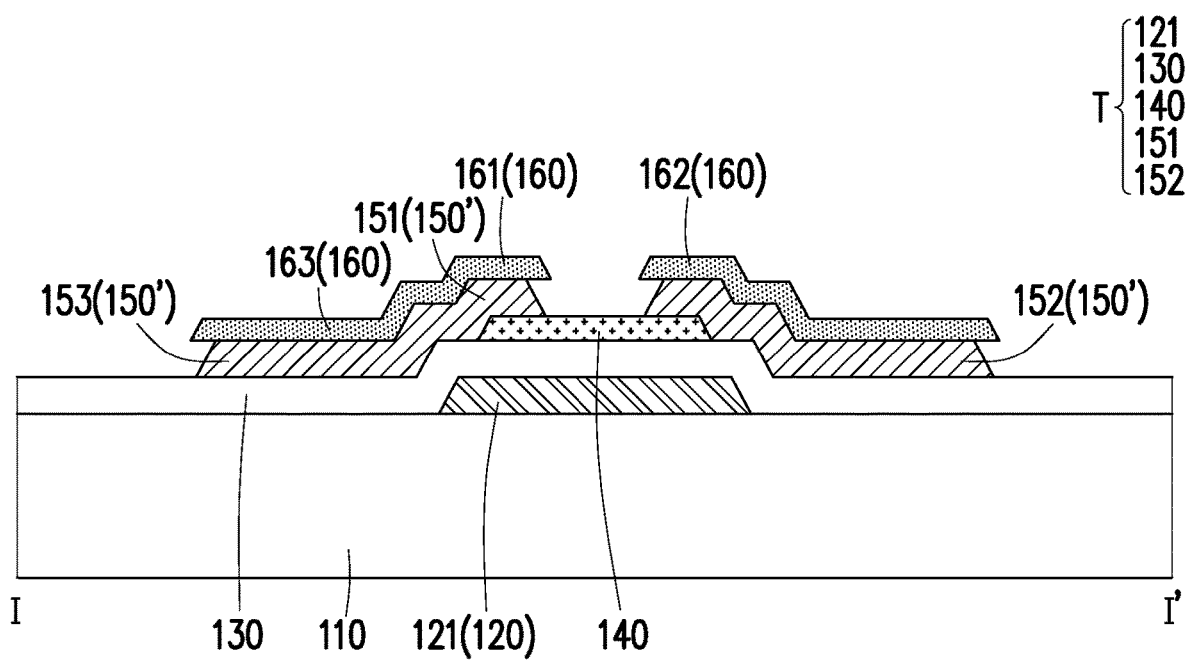

Referring to FIG. 1C and FIG. 2C, next, a conductive material layer 150 is formed to cover the semiconductor pattern 140 and a portion of the insulating layer 130. For example, in the present embodiment, the conductive material layer 150 may include molybdenum (Mo) and copper (Cu) stacked on the molybdenum. However, the invention is not limited thereto, and according to other embodiments, the conductive layer 120 may also use other conductive materials, such as an alloy, a nitride of a metal material, an oxide of a metal material, an oxynitride of a metal material, or a stacked layer of a metal material and other conductive materials.

Referring to FIG. 1C and FIG. 2C, next, a light shielding layer 160 is formed on the conductive material layer 150. The light shielding layer 160 is used as a shield for patterning the conductive material layer 150. In the present embodiment, the light shielding layer 160 may include a light shielding pattern 161, a light shielding pattern 162 separated from the light shielding pattern 161, and a light shielding line 163 connected to the light shielding pattern 161.

Figure 3:
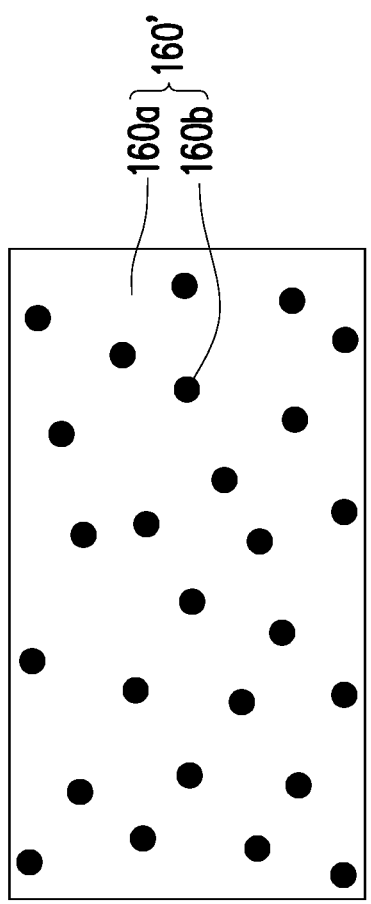
FIG. 3 is a partial enlarged schematic view of a light shielding layer 160 according to an embodiment of the invention.

FIG. 3 is a partial enlarged schematic view of a light shielding layer 160 according to an embodiment of the invention. Referring to FIG. 1C, FIG. 2C and FIG. 3, the light shielding layer 160 includes a photoresist 160a and particles 160b mixed within the photoresist 160a. The light shielding layer 160 can absorb light. The particles 160b are light absorbing particles. In the present embodiment, the light shielding layer 160 may be a black photoresist, but the invention is not limited thereto.

For example, in the present embodiment, the material of the photoresist 160a may include a phenolic resin, an acrylic resin, a siloxane or a combination thereof. The material of the particles 160b may include carbon, titanium oxide, titanium nitride or a combination thereof, but the invention is not limited thereto.

Referring to FIG. 1C, FIG. 1D, FIG. 2C and FIG. 2D, next, the conductive material layer 150 is patterned by using the light shielding layer 160 as a shield to form a conductive layer 150'. The insulating layer 130 is disposed between the conductive layer 150' and the conductive layer 120. The conductive layer 150' includes a conductive pattern 151, a conductive pattern 152 and a first signal line 153. The conductive pattern 151, the conductive pattern 152 and the first signal line 153 substantially coincide with the light shielding pattern 161, the light shielding pattern 162 and the light shielding line 163 respectively.

The conductive pattern 151 and the conductive pattern 152 are separated from each other and electrically connected to two different regions of the semiconductor pattern 140 respectively. The conductive pattern 151 is connected to the first signal line 153. In the present embodiment, the conductive pattern 151 may be used as a first end of the thin film transistor T, the conductive pattern 152 may be used as a second end of the thin film transistor T, and the first signal line 153 may be a data line.

The conductive pattern 121 (i.e., the control end), the insulating layer 130, the semiconductor pattern 140, the conductive pattern 151 (i.e., the first end) and the conductive pattern 152 (i.e., the second end) constitute a thin film transistor T. In the present embodiment, the conductive pattern 121 as the control end is disposed below the semiconductor pattern 140, and the thin film transistor T may be a bottom gate TFT. However, the invention is not limited thereto. According to other embodiments, the thin film transistor T may also be a top gate TFT or other suitable type of thin film transistor.

Referring to FIG. 1D, FIG. 1E, FIG. 2D and FIG. 2E, next, the light shielding layer 160 is heated to reflow the light shielding layer 160 to form a light shielding layer 160'. The reflowed light shielding layer 160' is disposed not only on top surfaces 151a, 152a, and 153a of the conductive layer 150', but also on sidewalls 151b, 152b, and 153b of the conductive layer 150'. In the present embodiment, the heating temperature may be 130° C. to 230° C. The heating time may be 10 minutes or 20 minutes, but the invention is not limited thereto. In an embodiment, the heating temperature may be 160° C. to 230° C. In other embodiments, the heating temperature may be 190° C. to 230° C. The material of the reflowed light shielding layer 160' is the same as that of the light shielding layer 160 described above, and the descriptions thereof are omitted here.

Figure 1E:
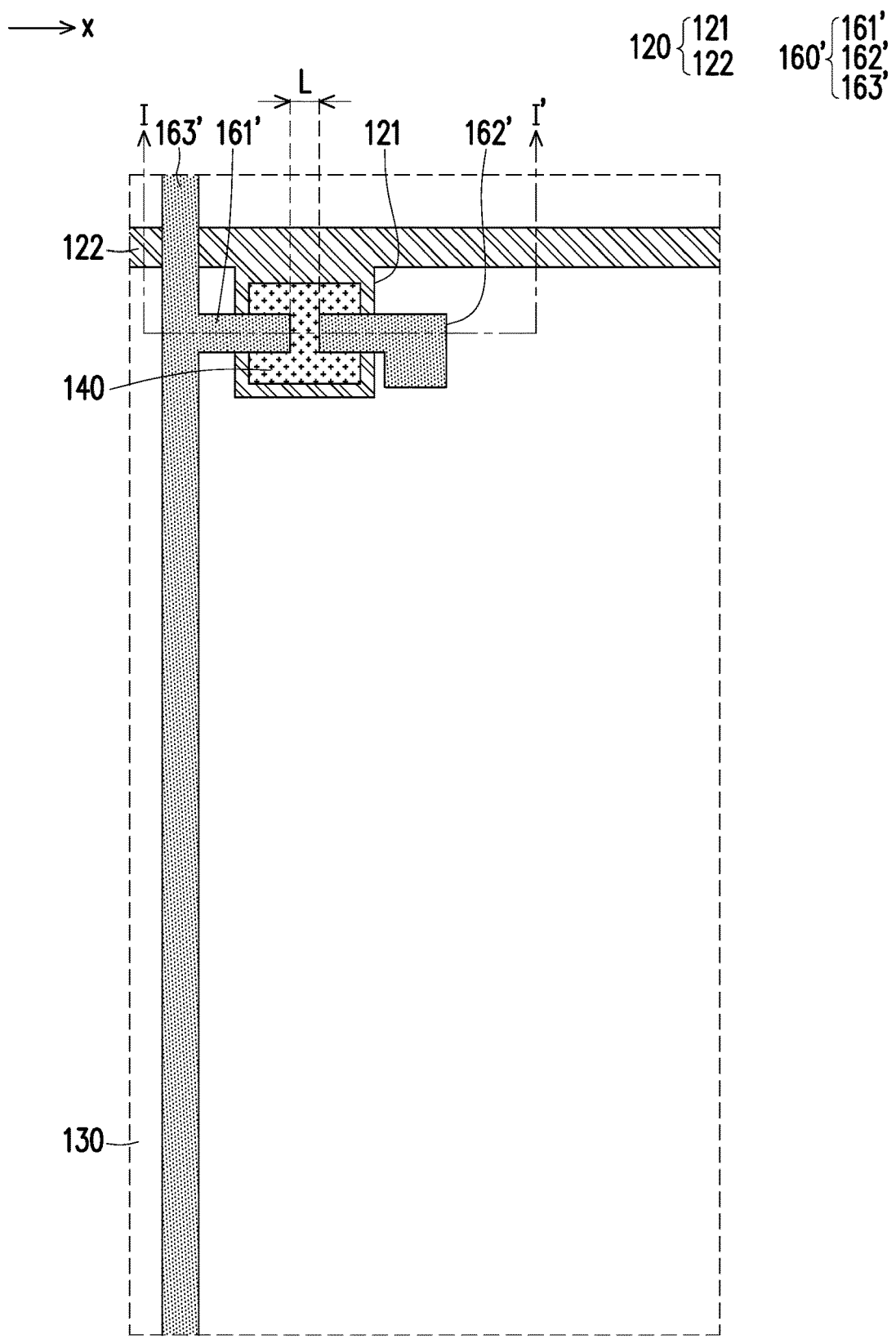
Figure 2E:
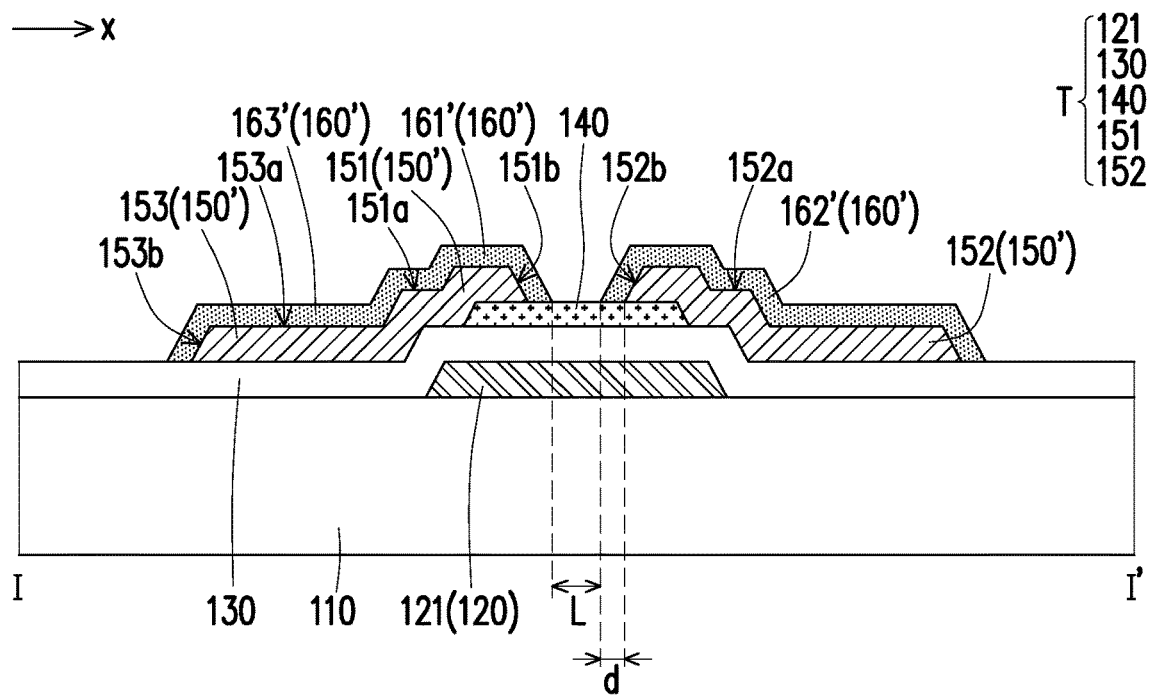

Referring to FIG. 1E and FIG. 2E, in the present embodiment, the reflowed light shielding layer 160' includes a light shielding pattern 161', a light shielding pattern 162' separated from the light shielding pattern 161', and a light shielding line 163' connected to the light shielding pattern 161'. The reflowed light shielding pattern 161' covers the top surface 151a and the sidewall 151b of the conductive pattern 151 of the thin film transistor T. The reflowed light shielding pattern 162' covers the top surface 152a and the sidewall 152b of the conductive pattern 152 of the thin film transistor T. The reflowed light shielding line 163' covers the top surface 153a and the sidewall 153b of the first signal line 153.

In the present embodiment, the light shielding layer 160' may have conductivity, and a gap (i.e., at the mark L) is provided between the light shielding pattern 161' and the light shielding pattern 162' which respectively cover the conductive patterns 151 and 152 (i.e., the first end and the second end) of the thin film transistor T. The gap (i.e., at the mark L) is overlapped with the semiconductor pattern 140 of the thin film transistor T. For example, in the arrangement direction x of the conductive pattern 151 and the conductive pattern 152, the gap between the light shielding pattern 161' and the light shielding pattern 162' has a width L, and L≥0.5 µm, but the invention is not limited thereto.

An edge of a vertical projection of the conductive layer 150' on the substrate 110 is at a distance d (shown in FIG. 2E) from an edge of a vertical projection of the reflowed light shielding layer 160' on the substrate 110. For example, in the present embodiment, 0.1 µm≤d≤1.5 µm, but the invention is not limited thereto.

Figure 1F:
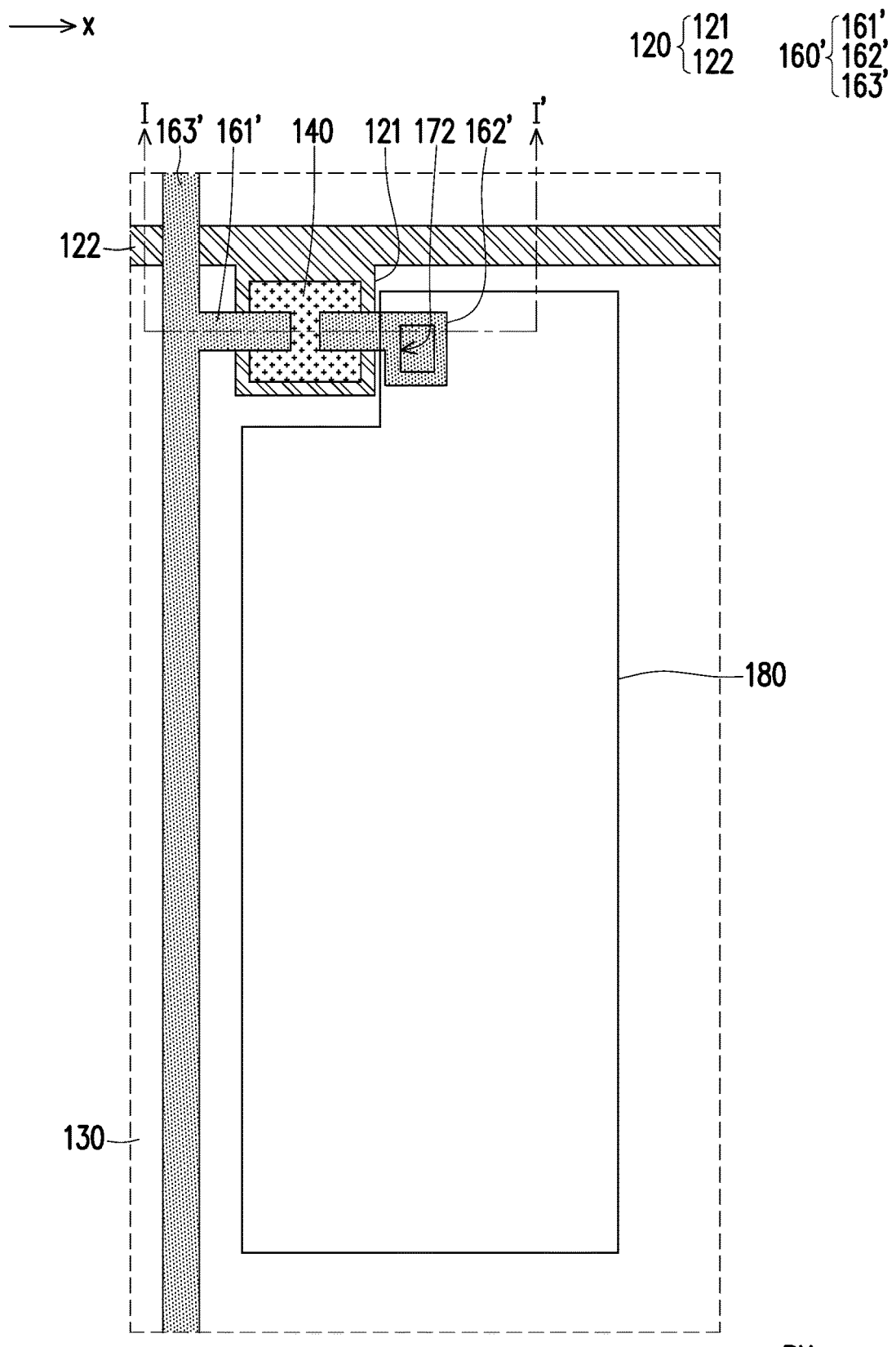
Figure 2F:
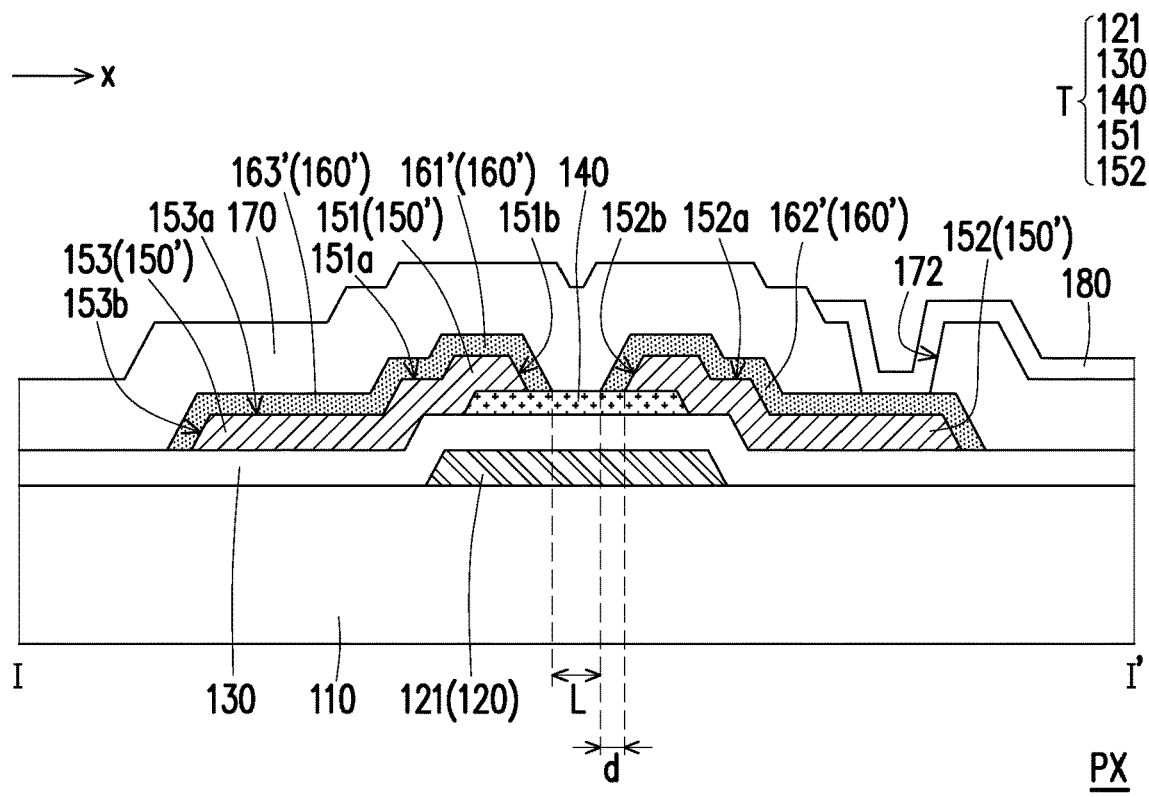

Referring to FIG. 1F and FIG. 2F, in the present embodiment, next, an insulating layer 170 is formed to cover the reflowed light shielding layer 160', a portion of the semiconductor pattern 140 and a portion of the insulating layer 130. Then, on the insulating layer 170, a pixel electrode 180 is formed. In the present embodiment, the pixel electrode 180 may be electrically connected to the conductive pattern 152 (i.e., the second end of the thin film transistor T) through a contact window 172 of the insulating layer 170 and the light shielding pattern 162'. Thus, the pixel structure PX of the present embodiment is completed.

It is worth noting that the reflowed light shielding layer 160' covers not only the top surfaces 151a, 152a, and 153a of the conductive layer 150', but also the sidewalls 151b, 152b, and 153b of the conductive layer 150'. That is, the light shielding layer 160' can reduce the amount of the ambient light beam (not shown) reflected by the top surfaces 151a, 152a, and 153a of the conductive layer 150', and can also reduce the amount of the ambient light beam reflected by the sidewalls 151b, 152b, and 153b of the conductive layer 150'. Thereby, the display panel using the pixel structure PX can have good optical performance, for example, high ambient contrast ratio (ACR).

Figure 4:
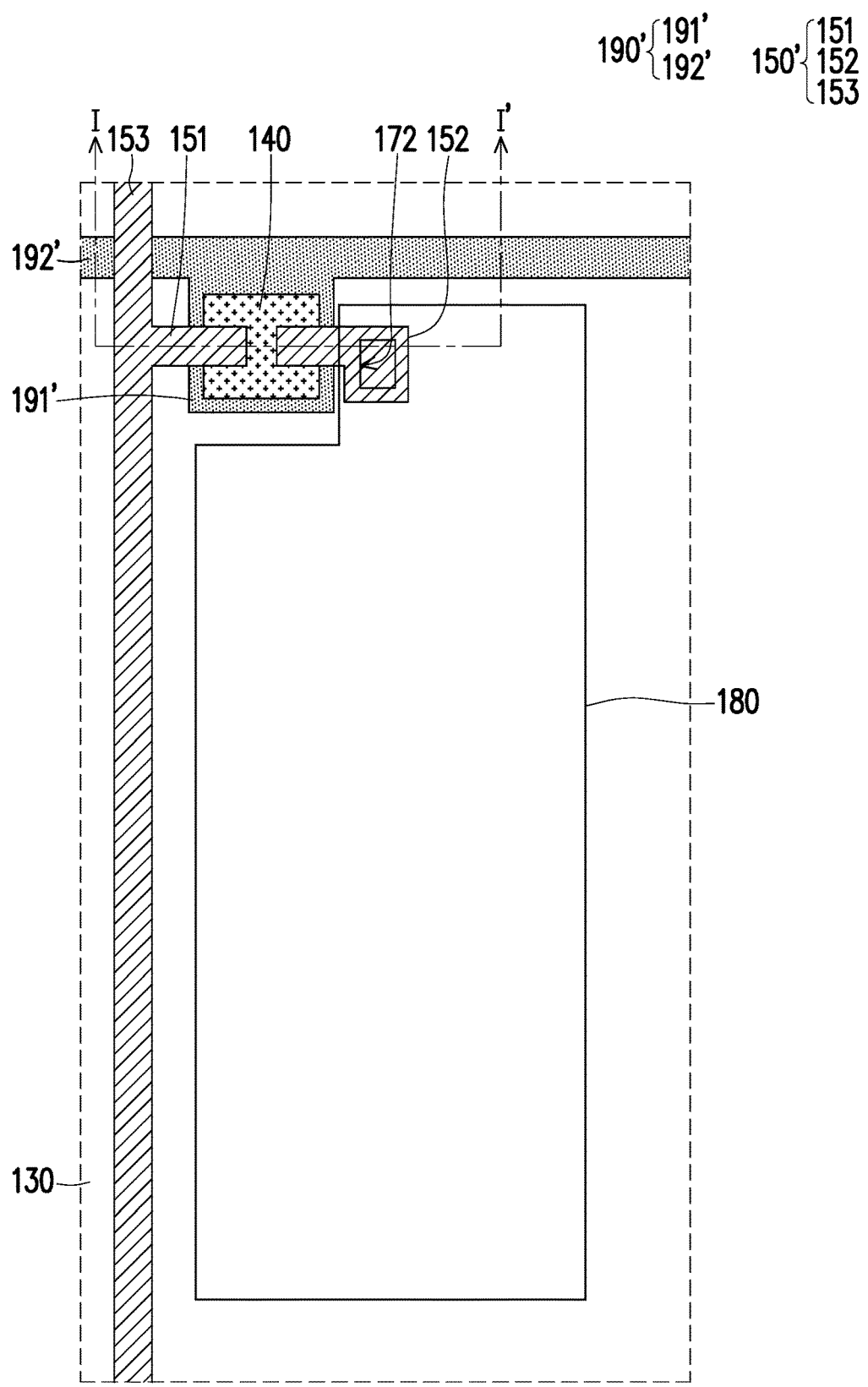
FIG. 4 is a top schematic view of a pixel structure PX-1 according to another embodiment of the invention.

FIG. 4 is a top schematic view of a pixel structure PX-1 according to another embodiment of the invention.

Figure 5:
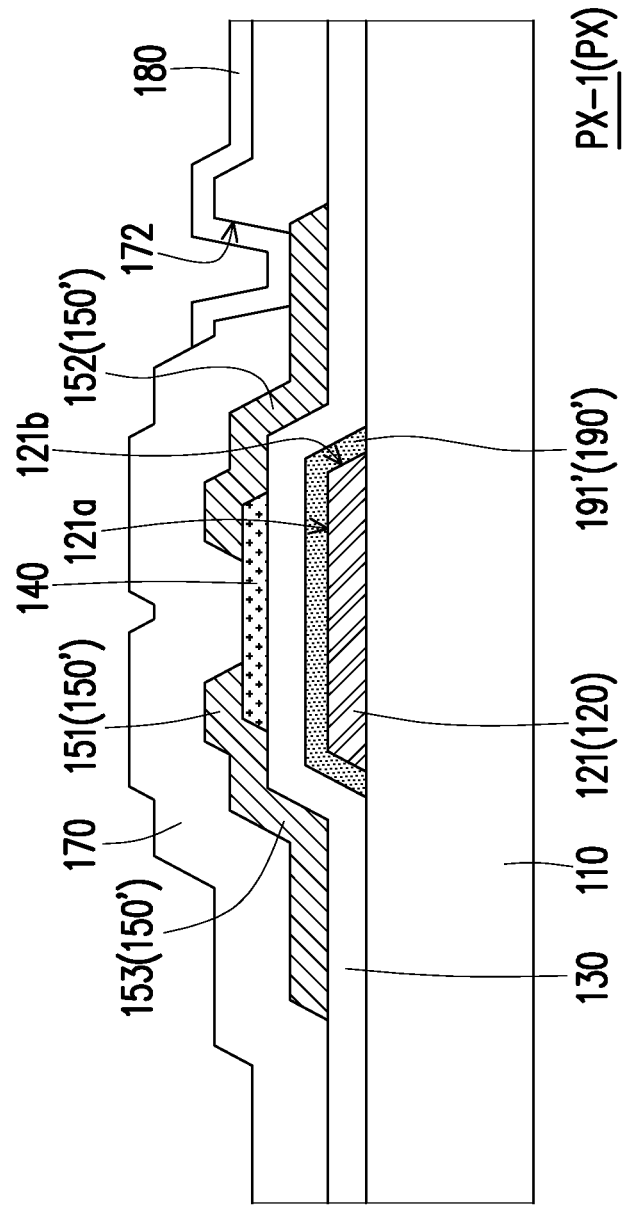
FIG. 5 is a cross-sectional schematic view of the pixel structure PX-1 according to another embodiment of the invention.

FIG. 5 is a cross-sectional schematic view of the pixel structure PX-1 according to another embodiment of the invention. FIG. 5 corresponds to line I-I' of FIG. 4.

Referring to FIG. 1F, FIG. 2F, FIG. 4 and FIG. 5, the pixel structure PX-1 of the present embodiment is similar to the pixel structure PX described above, and the difference between the two is as follows.

Referring to FIG. 4 and FIG. 5, in the present embodiment, a top surface 121a and a sidewall 121b of the conductive layer 120 are provided with a reflowed light shielding layer 190', and the top surfaces 151a, 152a, and 153a and the sidewalls 151b, 152b, and 153b of the other conductive layer 150' are not provided with the reflowed light shielding layer 160'.

Figure 6:
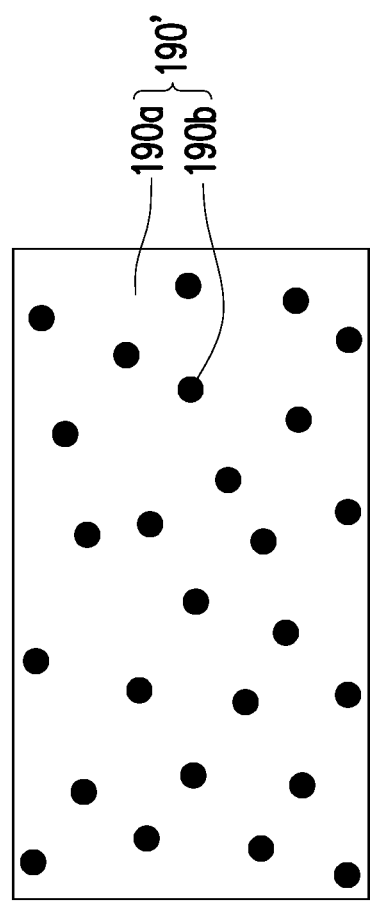
FIG. 6 is a partial enlarged schematic view of a light shielding layer 190' according to an embodiment of the invention.

FIG. 6 is a partial enlarged schematic view of a light shielding layer 190' according to an embodiment of the invention. Referring to FIG. 4, FIG. 5 and FIG. 6, the light shielding layer 190' includes a photoresist 190a and particles 190b mixed within the photoresist 190a. The light shielding layer 190' can absorb light. The particles 190b are light absorbing particles. In the present embodiment, the light shielding layer 190' may be a black photoresist, but the invention is not limited thereto.

For example, in the present embodiment, the material of the photoresist 190a may include a phenolic resin, an acrylic resin, a siloxane or a combination thereof. The material of the particles 190b may include carbon, titanium oxide, titanium nitride or a combination thereof, but the invention is not limited thereto.

In the present embodiment, the conductive layer 120 also includes a conductive pattern 121 (i.e., the control end of the thin film transistor T) and a second signal line connected to the conductive pattern 121 (not shown in FIG. 4 and FIG. 5, but reference may be made to the second signal line 122 of FIG. 1F), and the reflowed light shielding layer 190' includes a light shielding pattern 191' and a light shielding line 192'. The light shielding pattern 191' covers the top surface 121a and the sidewall 121b of the conductive pattern 121, and the light shielding line 192' covers the top surface and the sidewall (not shown) of the second signal line.

Figure 7:
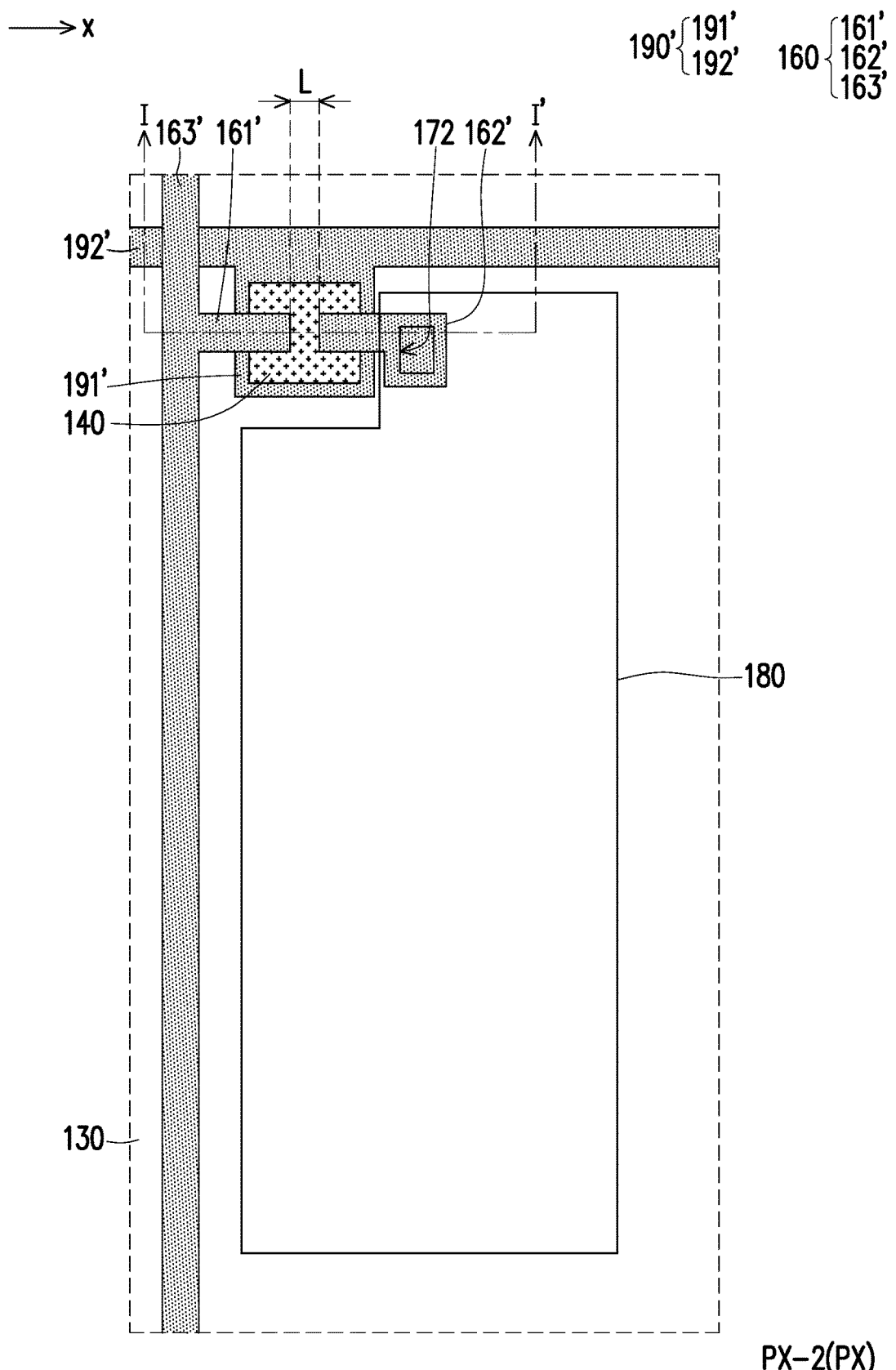
FIG. 7 is a top schematic view of a pixel structure PX-2 according to still another embodiment of the invention.

FIG. 7 is a top schematic view of a pixel structure PX-2 according to still another embodiment of the invention.

Figure 8:
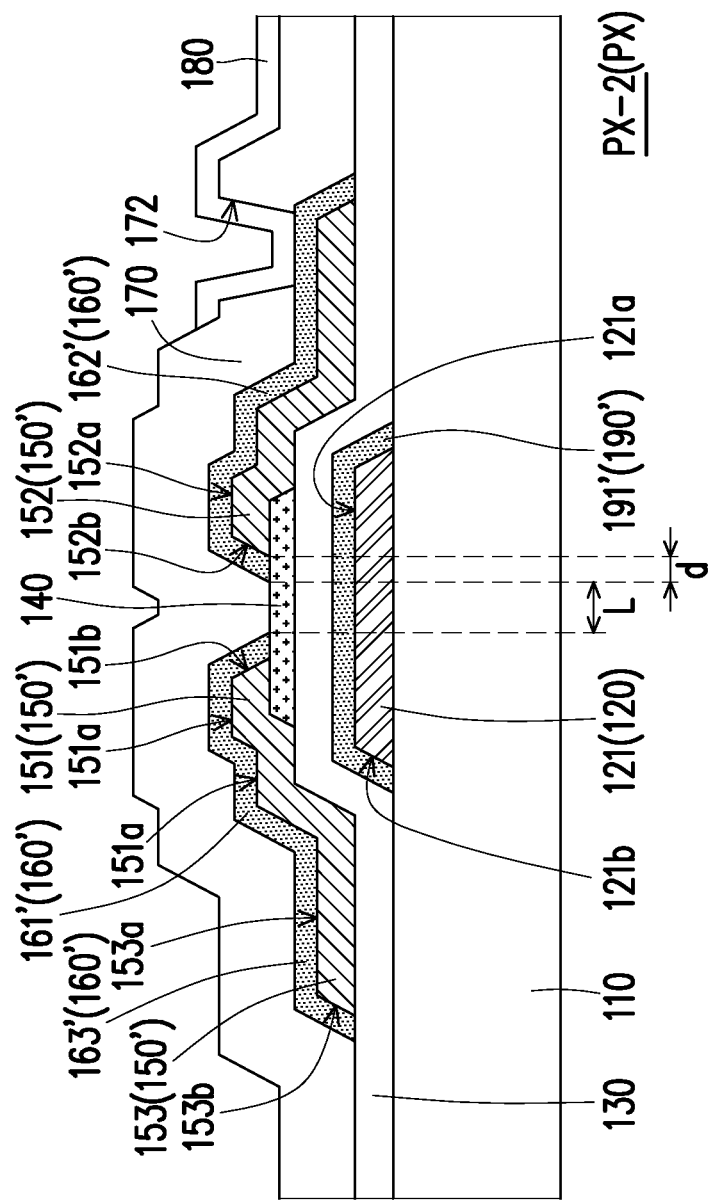
FIG. 8 is a cross-sectional schematic view of the pixel structure PX-2 according to still another embodiment of the invention.

FIG. 8 is a cross-sectional schematic view of the pixel structure PX-2 according to still another embodiment of the invention. FIG. 8 corresponds to line I-I' of FIG. 7.

Referring to FIG. 7 and FIG. 8, the pixel structure PX-2 of the present embodiment is similar to the pixel structures PX and PX-1 described above, and the difference is as follows: in the present embodiment, the top surface 121a and the sidewall 121b of the conductive layer 120 are provided with the reflowed light shielding layer 190', and the top surfaces 151a, 152a, and 153a and the sidewalls 151b, 152b, and 153b of the other conductive layer 150' are also provided with the reflowed light shielding layer 160'.

Based on the above, the pixel structure according to an embodiment of the invention includes a substrate, a thin film transistor disposed on the substrate and having a first end, a second end and a control end, a first signal line electrically connected to the first end of the thin film transistor, a second signal line electrically connected to the control end of the thin film transistor, a pixel electrode electrically connected to the second end of the thin film transistor and a reflowed light shielding layer. At least one of the first end of the thin film transistor, the second end of the thin film transistor, the control end of the thin film transistor, the first signal line and the second signal line is formed of a conductive layer.

In particular, the reflowed light shielding layer is disposed on the top surface and the sidewall of the conductive layer. That is, the reflowed light shielding layer can reduce the amount of the ambient light beam reflected by the top surface of the conductive layer, and can also reduce the amount of the ambient light beam reflected by the sidewall of the conductive layer. Thereby, the display panel using the pixel structure can have good optical performance, for example, high ambient contrast ratio (ACR).

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A pixel structure, comprising:
   a substrate;
   a thin film transistor, disposed on the substrate and comprising a first end, a second end and a control end;
   a first signal line, electrically connected to the first end of the thin film transistor;
   a second signal line, electrically connected to the control end of the thin file transistor;
   a pixel electrode, electrically connected to the second end of the thin film transistor, wherein the first end of the thin film transistor, the second end of the thin film transistor and the first signal line are formed of a first conductive layer; and
   a first light shielding layer, disposed on a top surface of the first conductive layer and a sidewall of the first conductive layer, wherein the first light shielding layer comprises a first photoresist and first particles mixed within the first photoresist,
   wherein the first light shielding layer comprises:
     a first light shielding pattern, disposed on a top surface of the first end of the thin film transistor and a sidewall of the first end of the thin film transistor; and
     a second light shielding pattern, disposed on a top surface of the second end of the thin film transistor and a sidewall of the second end of the thin film transistor,
     wherein a first gap is provided between the first light shielding pattern and the second light shielding pattern, a second gap is provided between the first end of the thin film transistor and the second end of the thin film transistor, and the first gap is located within the second gap.

2. The pixel structure according to claim 1, wherein a material of the first photoresist comprises a phenolic resin, an acrylic resin, a siloxane or a combination thereof.

3. The pixel structure according to claim 1, wherein a material of the first particles comprises carbon, titanium oxide, titanium nitride or a combination thereof.

4. The pixel structure according to claim 1, wherein the first particles are light absorbing particles.

5. The pixel structure according to claim 1, wherein a width of the gap is L, and L≥0.5 μm.

6. The pixel structure according to claim 1, wherein an edge of a vertical projection of the first conductive layer on the substrate is at a distance d from an edge of a vertical projection of the first light shielding layer on the substrate, and 0.1 μm≤d≤1.5 μm.

7. The pixel structure according to claim 1, wherein the first end of the thin film transistor, the second end of the thin film transistor, the control end of the thin film transistor, the first signal line and the second signal line are formed of the first conductive layer and a second conductive layer, and the pixel structure further comprises:
   an insulating layer, disposed between the first conductive layer and the second conductive layer; and
   a second light shielding layer, disposed on a top surface of the second conductive layer and a sidewall of the second conductive layer, wherein the second light shielding layer comprises a second photoresist and second particles mixed within the second photoresist.

8. The pixel structure according to claim 7, wherein a material of the second photoresist comprises a phenolic resin, an acrylic resin, a siloxane or a combination thereof.

9. The pixel structure according to claim 7, wherein a material of the second particles comprises carbon, titanium oxide, titanium nitride or a combination thereof.

* * * * *